(12) United States Patent
Spiteri et al.

(10) Patent No.: US 9,698,040 B2
(45) Date of Patent: Jul. 4, 2017

(54) SEMICONDUCTOR DEVICE CARRIER TAPE WITH IMAGE SENSOR DETECTABLE DIMPLES

(71) Applicant: STMicroelectronics (Malta) Ltd, Kirkop (MT)

(72) Inventors: Jeremy Spiteri, Msida (MT); Ivan Ellul, Zurrieq (MT)

(73) Assignee: STMicroelectronics (Malta) Ltd, Kirkop (MT)

( * ) Notice: Subject to any disclaimer, the term of this patent is extended or adjusted under 35 U.S.C. 154(b) by 0 days.

(21) Appl. No.: 14/926,084

(22) Filed: Oct. 29, 2015

(65) Prior Publication Data

US 2017/0125276 A1    May 4, 2017

(51) Int. Cl.
  *H01L 21/683*  (2006.01)
  *H01L 21/66*   (2006.01)
  *H01L 21/68*   (2006.01)

(52) U.S. Cl.
  CPC ........ *H01L 21/6836* (2013.01); *H01L 21/681* (2013.01); *H01L 22/12* (2013.01); *H01L 2221/68309* (2013.01)

(58) Field of Classification Search
  CPC .... H01L 21/6936; H01L 21/681; H01L 22/12
  See application file for complete search history.

(56) References Cited

U.S. PATENT DOCUMENTS

| | | | |
|---|---|---|---|
| 5,126,824 A | 6/1992 | Ueda | |
| 7,694,825 B1 * | 4/2010 | Md Sulamin | B65D 85/671 206/714 |
| 8,448,332 B2 | 5/2013 | Planelle et al. | |
| 2002/0005370 A1 * | 1/2002 | Hatakeyama | B65D 73/02 206/714 |
| 2002/0005371 A1 * | 1/2002 | Susaki | B65D 73/02 206/714 |
| 2003/0218236 A1 * | 11/2003 | Wright | H01L 21/67132 257/668 |
| 2004/0017001 A1 | 1/2004 | Chung et al. | |
| 2004/0093721 A1 | 5/2004 | Watson | |
| 2006/0157381 A1 * | 7/2006 | Adams | H05K 13/0084 206/713 |
| 2007/0023931 A1 * | 2/2007 | Chew | H05K 13/0084 257/787 |
| 2007/0074996 A1 * | 4/2007 | Nice | H05K 13/0084 206/714 |

(Continued)

FOREIGN PATENT DOCUMENTS

JP    11-301774    * 11/1999

*Primary Examiner* — Minh-Loan Tran
*Assistant Examiner* — Farid Khan
(74) *Attorney, Agent, or Firm* — Gardere Wynne Sewell LLP

(57) ABSTRACT

A semiconductor device carrier tape with image sensor detectable dimples is disclosed. The dimpled carrier tape is formed of a flexible strip of material. A plurality of pockets are disposed spaced apart along the length of the flexible strip of material. Each pocket is configured to hold a semiconductor device. A dimple is formed in each of the plurality of pockets where each dimple has a peripheral edge and a bottom surface. Detection of the dimple by an image sensor facilitates alignment of a semiconductor device with the pocket and precise placement of the semiconductor device in the pocket.

17 Claims, 3 Drawing Sheets

(56) References Cited

U.S. PATENT DOCUMENTS

| | | | | |
|---|---|---|---|---|
| 2008/0000804 A1* | 1/2008 | Carey | ................ | H05K 13/0084 |
| | | | | 206/714 |
| 2008/0004746 A1* | 1/2008 | Jahnke | ............... | B65H 23/1884 |
| | | | | 700/229 |
| 2008/0296201 A1* | 12/2008 | Lalouch | ............. | H05K 13/0084 |
| | | | | 206/714 |
| 2009/0032430 A1* | 2/2009 | Wihren | ............. | H05K 13/0084 |
| | | | | 206/526 |
| 2012/0186862 A1 | 7/2012 | Hong et al. | | |
| 2014/0305771 A1* | 10/2014 | Ng | ........................ | B65G 15/30 |
| | | | | 198/713 |

* cited by examiner

SEMICONDUCTOR DEVICE CARRIER TAPE WITH IMAGE SENSOR DETECTABLE DIMPLES

TECHNICAL FIELD

The present invention relates to semiconductor devices, and more particularly to processing semiconductor devices using a carrier tape.

BACKGROUND

Electronic devices, for example semiconductor devices, are often carried by a carrier tape in connection with certain processing operations. For example, semiconductor devices may be placed in and shipped in a carrier tape to enable assembly of the semiconductor device in an electronic device to be purchased by a consumer, such as a computer, smartphone, tablet computer and the like.

A portion of a conventional semiconductor device carrying carrier tape 10 is shown in FIGS. 1A and 1B. FIG. 1A is a top plan view of the portion of the conventional carrier tape 10, and FIG. 1B is a cross-sectional view of the carrier tape of FIG. 1A. The carrier tape 10 includes spaced-apart pockets 12 that are each configured to hold a semiconductor device 14. According to certain embodiments, the semiconductor device 14 may be an integrated circuit including a microphone, and therefore the device package may have a sound inlet 15. Feeder holes 16 are disposed adjacent to the pockets 12 and along an edge of the carrier tape 10. The feeder holes 16 allow processing equipment to advance the carrier tape 10 through the various processing operations, including the placement of the semiconductor devices 10.

An imaging sensor or camera may be used to visually inspect the carrier tape 10 and detect a hole 18 in the pocket 12 of the carrier tape 10. The hole 18 is used by the equipment to determine a position of the carrier tape 10, and more specifically to determine a position of a particular pocket 12 of the carrier tape 10 so that the semiconductor device 14 can be properly placed in the pocket 12. The hole 18 also serves to provide the equipment information as to whether or not the pocket 12 is carrying a semiconductor device 14, and therefore is unavailable for placement of another semiconductor device. That is, if the imaging sensor attempts to detect the hole 18 and does not detect the hole 18, it is determined that a semiconductor device 14 is in the pocket as shown in two of the pockets 12 of FIG. 1A.

FIG. 2 represents a display of an image 20 of the carrier tape 10 of FIG. 1A captured by an imaging device. The display is illustrated as a window of a software program associated with the imaging sensor or camera. The bottom surface of the pocket 12 and the top surface of the carrier tape 10 reflect a particular wavelength of light that is captured by the imaging sensor. The image 22 representing the hole 18 contrasts the image 24 of the bottom surface of the pocket 12. In this example, the background viewed through the hole 18 is represented as a solid black circle or dot 22. Thus, the pockets 12 in the image that show a solid black circle 22 indicate an empty pocket, and image 26 of the pocket 12 that does not show a solid black circle indicates a pocket that is carrying a semiconductor device 14.

The hole in the bottom of the pocket is a weak point of the carrier tape and is subject to cracking and breaking. Also, the punching operation that creates the holes in conventional carrier tapes may leave burrs that may interfere with one or more semiconductor processing operations. Further, the hole allows unwanted particles from the ambient environment to contaminate the pocket and the electronic device.

An improved carrier tape that does not require a hole in the bottom surface of the pocket, yet still is detectable by current semiconductor device processing imaging equipment is desirable in the semiconductor device processing art.

SUMMARY

Embodiments according to the teachings of the present disclosure include a semiconductor device carrier tape with image sensor detectable dimples. The dimpled carrier tape is formed of a flexible strip of material. A plurality of pockets is disposed spaced apart along the length of the flexible strip of material. Each pocket is configured to hold a semiconductor device. A dimple is formed in each of the plurality of pockets where each dimple has a peripheral edge and a bottom surface. The dimple is detectable by an image sensor, and detection of the dimple facilitates alignment of a semiconductor device with the pocket and precise placement of the semiconductor device in the pocket. According to certain embodiments, the peripheral edge is the part of dimple that is detectable by the image sensor. The bottom surface of the dimple may also be detected by the image sensor.

According to one embodiment, a primary bottom surface of the pocket, the peripheral edge, and the bottom surface of the dimple is a continuous, uninterrupted surface. As such, contaminants from the ambient environment are prevented from entering the pocket, as occasionally occurs with prior art, holed semiconductor carrier tape.

According to one embodiment, the semiconductor device includes spaced apart feeder holes disposed along an edge of the tape and adjacent to the pockets. The feeder holes allow the semiconductor tape to be advanced, which enables placement or picking of the semiconductor device for further processing, such as assembly into a personal telecommunications or personal recording device.

A method of placing a semiconductor device into a dimpled carrier tape according to the teachings of the present disclosure includes the steps of detecting, using an image sensor, a dimple in a pocket of a carrier tape. In certain embodiments, this detection may be of the peripheral edge of the dimple or a surface textured bottom surface of the dimple, or both. A semiconductor device is aligned with the pocket based on the detection of the dimple, and the semiconductor device is placed in the pocket. If the imaging sensor does not detect a dimple in a particular pocket of the carrier tape, it is determined that a semiconductor device was previously placed in the particular pocket.

BRIEF DESCRIPTION OF THE DRAWINGS

Further features and advantages will become apparent from the following and more particular description of the preferred and other embodiments, as illustrated in the accompanying drawings in which like reference characters generally refer to the same parts, functions or elements throughout the views, and in which.

DETAILED DESCRIPTION OF THE DRAWINGS

Figure 1A:
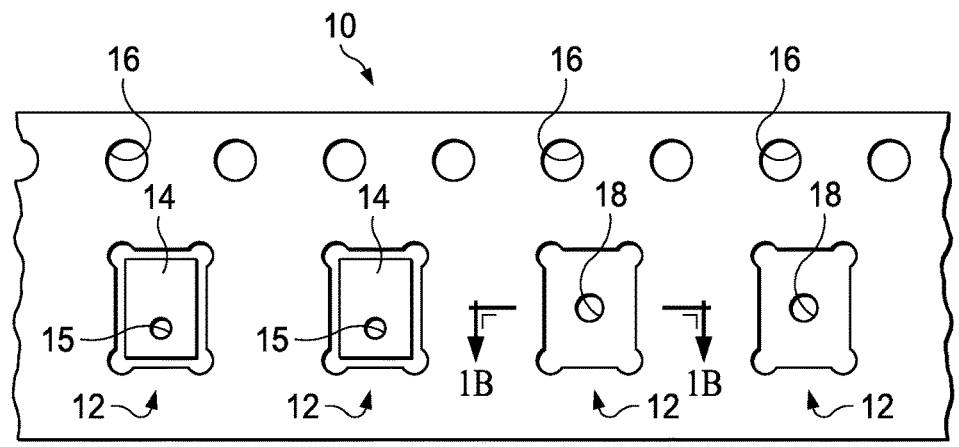
FIG. 1A is a top plan view of a portion of a prior art, holed carrier tape; shows a schematic of a side view of a semiconductor device.
Figure 1B:
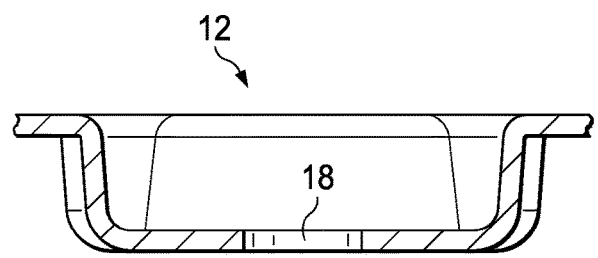
FIG. 1B is a cross section of a pocket of the prior art, holed tape shown in FIG. 1A.
Figure 2:
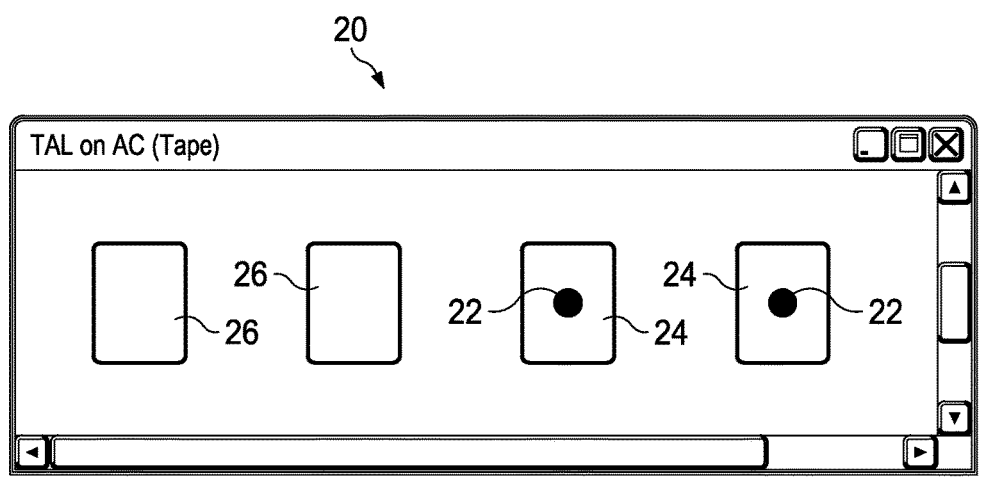
FIG. 2 shows a screen shot of software program associated with an image sensor or camera-type device and represents the image of the portion of the carrier tape of FIG. 1A.
Figure 3A:
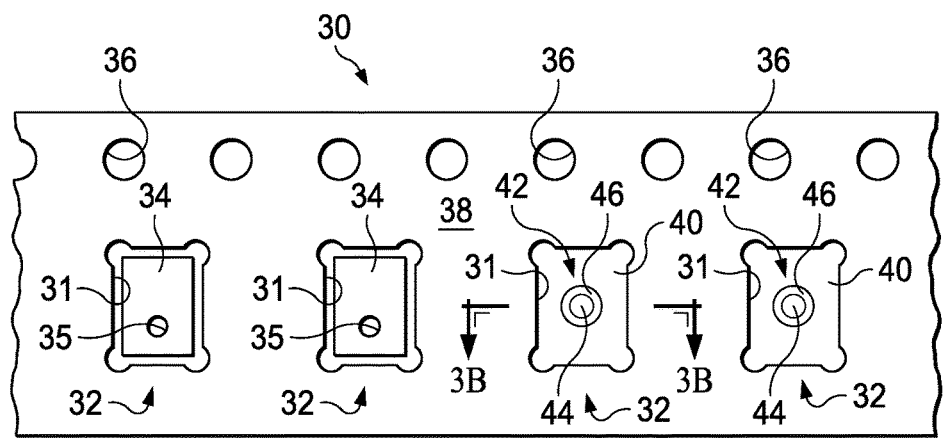
FIG. 3A is a top plan view of a portion of a dimpled carrier tape according to the teachings of the present disclosure.
Figure 3B:
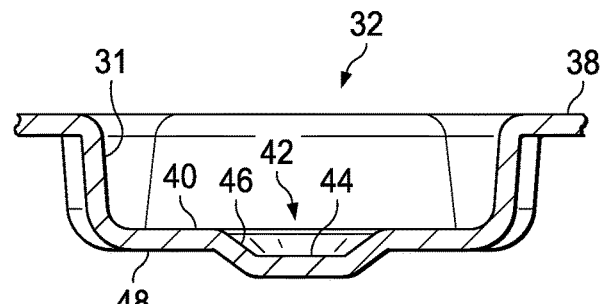
FIG. 3B is a cross section of a pocket of the dimpled carrier tape shown in FIG. 3A.

Reference is now made to FIGS. 3A and 3B. FIG. 3A is a top plan view of a portion of a carrier tape 30 according to the teachings of the present disclosure. FIG. 3B is a cross-section of a pocket 32 of the carrier tape 30 of FIG. 1A. The carrier tape 30 is formed of a flexible material. For example, the carrier tape 30 may be formed from a polymeric material such that it is generally rigid but may be coiled on a spool, reel, or other similar apparatus. According to an alternate embodiment, the carrier tape 30 may be formed of a thin, coilable metal. The carrier tape 30 generally has a uniform thickness. In certain embodiments, a thickness of the carrier tape is 0.3 mm plus or minus 0.05 mm. The pockets 32 are formed in an upper surface 38 and spaced apart on the carrier tape 30. Each pocket 32 is configured to hold a single semiconductor device 34. According to certain embodiments, the semiconductor device 34 may be an integrated circuit including a microphone, and therefore the semiconductor device 34 may have a sound inlet 35. Disposed adjacent to the plurality of spaced apart pockets are a plurality of feed holes 36 disposed along an edge of the carrier tape 30. The feed holes 36 allow the advancing equipment to advance the carrier tape 30 to further process the semiconductor devices 34.

Each pocket 32 is defined by a pocket sidewall 31 around a perimeter of the pocket 32. The pocket 32 also includes a primary pocket surface, which is a bottom surface 40 of the pocket 32. In certain embodiments, the surface texture of the primary pocket surface 40 may be the same as the surface texture for the upper surface 38 of the carrier tape 30. A dimple 42 is formed in the primary pocket surface 40. The dimple 42 is generally centered in the pocket 32 as shown. However, this disclosure contemplates any suitable position of the dimple 42 within the pocket 32. A non-centered position of the dimple 42 may require calibrating the imaging software to correlate the off-center dimple 42 with the location of the pocket 32. The dimple 42 includes a generally flat dimple surface 44 at its base and a peripheral edge 46 sloping at an angle upward from the dimple surface 44 to the primary pocket surface 40. The dimple 42 extends from an underside surface 48 of the pocket 32, as seen in FIG. 3B. This extension is minimal so as not to interfere with existing carrier tape processing equipment.

According to certain embodiments, the pocket 32 of the carrier tape 30 including the dimple 42 is formed in a stamping operation that plastically deforms the pocket 32 and the dimple 42 in a single application of a die of a stamping machine. A single stamping operation forms the dimple 42 and the pocket 32 so as to avoid any possible misalignment of the dimple 42 in the pocket 32 that might result if the dimple 42 was formed by a separate stamping die than the die that formed the pocket 32. Such misalignment may cause the placement operation to be less precise and possibly fail.

According to certain embodiments, a carrier tape blank may be formed by a plastic extrusion process. The carrier tape blank is received by a hot stamping machine where the blank is heated and a die with a reverse shape of the pocket 32 and dimple 42 is applied to the blank. The die forms the primary dimple surface 44 and the peripheral edge 46 of the dimple. The curvature and shape of the peripheral edge 46 may depend on the type of material forming the blank. For example, a peripheral edge formed in a polymeric material may have a more rounded peripheral edge 46, than the sloped peripheral edge 46 shown in FIG. 3B. According to alternate embodiments of the present disclosure the carrier tape 30 including the dimple 42 may be formed by any suitable material forming process. For example, the carrier tape 30 may be injection molded.

Regardless whether the peripheral edge 46 is generally rounded or generally straight, the peripheral edge 46 reflects light differently than the bottom surface 40 of the pocket, and therefore creates a contrast that is detectable by an imaging sensor or camera.

Figure 4:
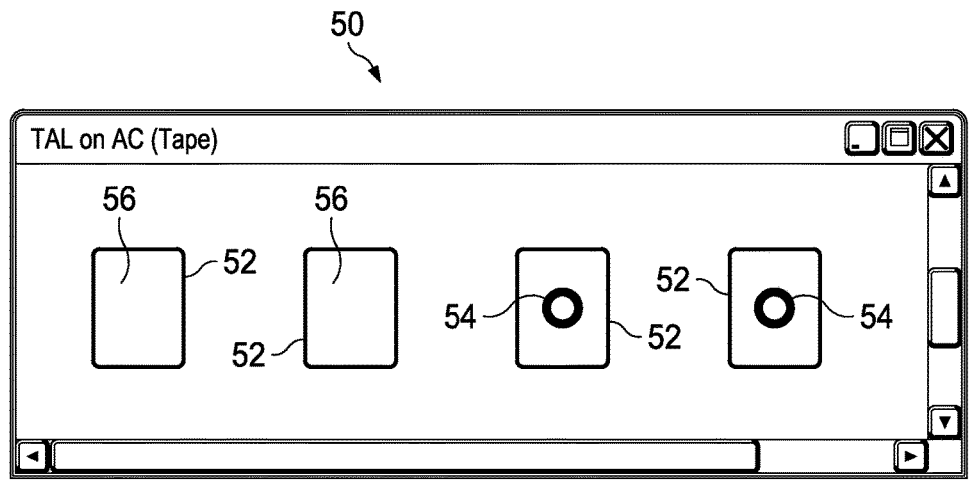
FIG. 4 shows a screen shot of software program associated with an image sensor or camera-type device and represents the image of the portion of the dimpled carrier tape of FIG. 3A.

FIG. 4 represents a display of an image 50 of the carrier tape of FIG. 3A captured by an imaging device or camera. The display is illustrated as a window of a software program associated with the imaging sensor. The image sensor or camera detects a contrast between certain surfaces of the carrier tape 30. For example, the image sensor detects a contrast between the carrier tape upper surface 38 and the pocket sidewall 31, which is represented by a heavy black line 52. The imaging sensor also detects a contrast between the primary pocket surface 40 and the peripheral edge 46 of the dimple 42, which is represented by a heavy black circle 54. The image sensor uses the information with respect to the peripheral edge image 54 to determine a position of the pocket 32, to enable alignment and precise placement of the semiconductor device 34. A diameter of the peripheral edge 46 and the corresponding peripheral edge image 54 is known such that the detection of the peripheral edge 46 allows the semiconductor device placement equipment to determine a precise position of a pocket 32 on the carrier tape 30. For example, the camera or imaging device finds the peripheral edge of the dimple 42 and from that information determines a center of the dimple 42 and therefore a precise position of the pocket 42 so that the placement operation of the semiconductor device 34 is aligned with the determined center of the dimple 42.

Thus, the semiconductor device 34 may be accurately placed in the known position of the pocket 32. A determination by the image sensor that the peripheral edge 46 of the dimple is not detected communicates to the placement equipment that the pocket 32 is occupied by a semiconductor device 34, and therefore is not available for placement of another semiconductor device. For example, images 56 of the pocket outline 52 correspond to the image sensor viewing pockets 32 with a semiconductor device 34 disposed in the pocket 32.

Figure 5A:
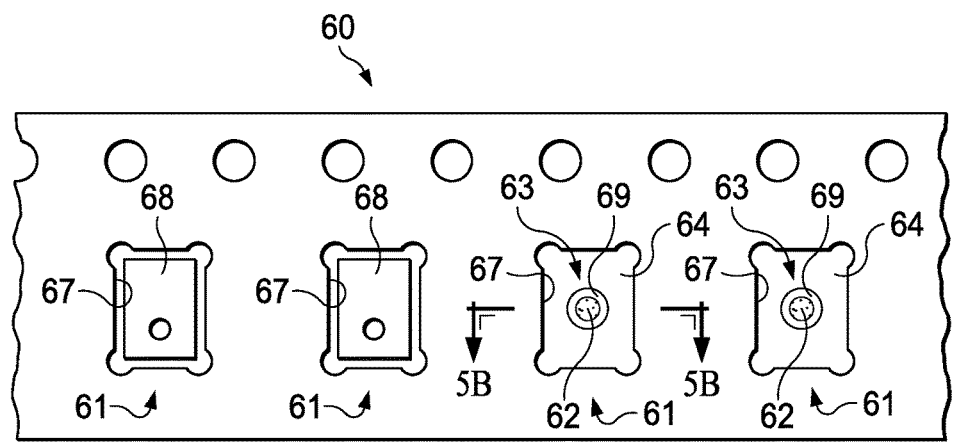
FIG. 5A is a top plan view of a portion of an alternate embodiment of a dimpled carrier tape according to the teachings of the present disclosure.
Figure 5B:
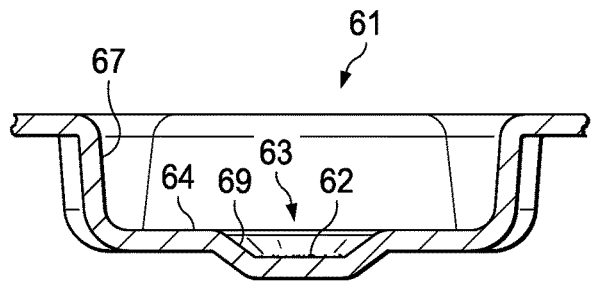
FIG. 5B is a cross section of a pocket of the dimpled carrier tape shown in FIG. 5A.

Reference is now made to FIGS. 5A and 5B, which show an alternate embodiment of a dimpled carrier tape 60 with dimples 63 in pockets 61 according to the teachings of the present disclosure. In certain embodiments, the primary dimple surface may also be detected by the image sensor. For example, the primary dimple surface 62 may include a surface texture that reflects light differently than the primary pocket surface 64. In this manner, the primary dimple surface 62 in addition to or in lieu of the peripheral edge 69 of the dimple 63 may be detected by the image sensor and the position of the pocket 61 may be determined, as well as whether the pocket 61 is empty or contains a semiconductor device 68 in the same manner as described above with respect to FIGS. 3A-4.

Figure 6:
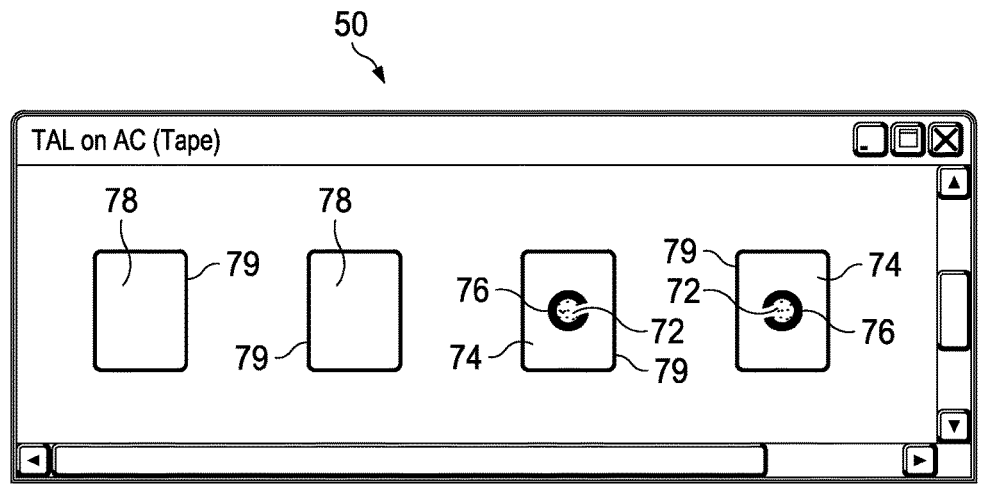
FIG. 6 shows a screen shot of a software program associated with an image sensor or camera-type device and represents the image of the portion of the dimpled carrier tape of FIG. 5A.

FIG. 6 represents a display of an image 70 of the carrier tape of FIG. 5A captured by an imaging device or camera. The display is illustrated as a window of a software program associated with the imaging sensor. The image sensor detects the surface texture of the primary dimple surface 62. Thus, image 72 shows a contrast between the image 74 of the primary pocket surface 64. The imaging sensor may also detect a contrast between the primary pocket surface 64 and the peripheral edge 69 of the dimple 63, represented by the heavy black circle 76. The image sensor uses the information with respect to the image 72 of the surface textured primary dimple surface 62 and possibly the image 76 of the peripheral edge 69 of the dimple 63 to determine a position of the pocket 61, to enable alignment and precise placement of a semiconductor device.

A determination by the image sensor and the software associated with the image sensor that the textured primary surface 62 of the dimple 63 is not visible, and therefore not detectable, communicates to the placement equipment that the pocket 61 is occupied by a semiconductor device 68, and therefore is not available for placement of another semiconductor device. For example, image 78 within a heavy line 79 representing the pocket sidewall 67 corresponds to the image sensor viewing the pockets 61 with a semiconductor device 68 disposed in the pocket 61.

According to certain embodiments, the surface textured primary dimple surface 62 is formed according to the process described above with respect to FIGS. 3A-3B. For example, a hot stamping machine may include a die that has the reverse of the surface texture such that the surface texture is imparted on the primary dimple surface 62 upon pressing by the die.

A carrier tape including the dimpled pockets as described herein, has the added advantage that the bottom of the carrier tape is a solid, unitary, integral body, and has no holes in the pocket for contaminating particles from the ambient environment to reach the electronic device or the inside of the pocket. Thus, the semiconductor device is better protected than in conventional carrier tape systems. Also, the pocket is free from burrs that are sometimes left on the perimeter of a pocket hole by the punching operation that creates the holes in conventional carrier tapes. Such burrs may interfere with the semiconductor processing operation.

The present invention is not limited to the examples described above. The arrangements, shapes and dimensions of the pockets and the dimples may be different. In addition, the pockets may have rectangular, circular or polygonal shapes. Other variants are possible without departing from the scope defined by the appended claims.

What is claimed is:

1. A semiconductor device carrier tape, comprising:
    a flexible strip of material;
    a plurality of pockets disposed spaced apart along a length of the flexible strip of material, each pocket having a primary bottom surface and being configured to hold a semiconductor device; and
    a dimple formed in each of the plurality of pockets, each dimple comprising a peripheral edge and a bottom surface, the bottom surface of each dimple including a surface texture that is different from the primary bottom surface of each pocket.

2. The semiconductor device carrier tape of claim 1, wherein the peripheral edge of the dimple is detectable by an image sensor.

3. The semiconductor device carrier tape of claim 1, wherein the bottom surface of the dimple is detectable by the image sensor.

4. The semiconductor device carrier tape of claim 1, further comprising a plurality of feed holes spaced apart along the length of the flexible strip of material.

5. The semiconductor device carrier tape of claim 1, wherein the primary bottom surface of the pocket, the peripheral edge and the bottom surface of the dimple is a continuous, uninterrupted surface.

6. The semiconductor device carrier tape of claim 1, wherein the peripheral edge is rounded.

7. The semiconductor device carrier tape of claim 1, wherein the peripheral edge is a sloped surface.

8. The semiconductor device carrier tape of claim 1, wherein the dimple extends from an underside of the pocket.

9. A method for placing a semiconductor device in a pocket of a carrier tape, comprising:
    detecting, using an image sensor, a dimple in a pocket of a carrier tape;
    aligning a semiconductor device with the pocket based on the detection of the dimple; and
    placing the semiconductor device in the pocket.

10. The method of claim 9, further comprising determining a position of the pocket from the detected dimple.

11. The method of claim 9, wherein detecting the dimple comprises detecting a contrast between an image of a bottom surface of the pocket and an image of a peripheral edge of the dimple.

12. The method of claim 9, wherein detecting the dimple comprises detecting a contrast between an image of a bottom surface of the pocket and an image of a bottom surface of the dimple.

13. The method of claim 12, wherein detecting the contrast comprises detecting a surface texture of the bottom surface of the dimple.

14. The method of claim 9, further comprising using the image sensor to detect that the dimple is covered by a previously placed semiconductor device.

15. The method of claim 9, wherein the aligning the semiconductor device with the pocket is based on the detection of a peripheral edge of the dimple.

16. The method of claim 9, wherein the aligning the semiconductor device with the pocket is based on detecting a bottom surface of the dimple.

17. The method of claim 9, further comprising advancing the carrier tape after the placement of the semiconductor device.

* * * * *